US012785674B1

(12) United States Patent
Ardeshana

(10) Patent No.: US 12,785,674 B1
(45) Date of Patent: Nov. 3, 2026

(54) DYNAMIC SWITCH ARCHITECTURE USING THIN OXIDE CORE DEVICES

(71) Applicant: Cadence Design Systems, Inc., San Jose, CA (US)

(72) Inventor: Gauravkumar Pravinbhai Ardeshana, Bangalore (IN)

(73) Assignee: Cadence Design Systems, Inc., San Jose, CA (US)

( * ) Notice: Subject to any disclaimer, the term of this patent is extended or adjusted under 35 U.S.C. 154(b) by 74 days.

(21) Appl. No.: 19/039,387

(22) Filed: Jan. 28, 2025

(51) Int. Cl.
*H03K 17/042* (2006.01)
*H03K 17/082* (2006.01)
*H03K 17/10* (2006.01)

(52) U.S. Cl.
CPC ... *H03K 17/102* (2013.01); *H03K 2217/0027* (2013.01); *H03K 2217/0054* (2013.01)

(58) Field of Classification Search
CPC .... H03K 17/00; H03K 17/002; H03K 17/042; H03K 17/04206; H03K 17/082; H03K 17/0822; H03K 17/6871; H03K 17/6872
USPC ....... 327/427, 403, 404, 437, 376, 377, 383, 327/387
See application file for complete search history.

(56) References Cited

U.S. PATENT DOCUMENTS 9,401,711 B2 * 7/2016 Chan .................... H03K 17/145
11,422,581 B2 * 8/2022 Dey ......................... G05F 3/205
12,633,915 B1 * 5/2026 Jain .................... H03K 17/6872

* cited by examiner

*Primary Examiner* — Hai L Nguyen
(74) *Attorney, Agent, or Firm* — Foley & Lardner LLP

(57) ABSTRACT

The present embodiments relate to electronic devices, and more particularly to an architecture for a switch that can be implemented using only thin oxide devices, even for high voltage applications. As such, in an enable mode, the switch can pass high voltage levels without any reliability concerns. In addition, a switch having an architecture according to embodiments exhibits a low on resistance across the entire input voltage range. Nevertheless, it can fully turn off while the switch is in a disable mode, with very little leakage current. A switch having an architecture according to embodiments can be particularly useful in parallel connection applications where multiple switches are connected in parallel and only one switch is enabled and the other parallel connected switches are disabled.

20 Claims, 14 Drawing Sheets

DYNAMIC SWITCH ARCHITECTURE USING THIN OXIDE CORE DEVICES

TECHNICAL FIELD

The present embodiments relate to electronic devices, and more particularly, to an architecture for a dynamic switch using thin oxide core devices in low technology nodes.

BACKGROUND

Integrated circuits can contain millions of devices. Meanwhile, the continued need for higher data rates in the AI era has demanded the evolution of technology process nodes to reduce feature sizes. The shift of dominant transistor structures from BJT to MOSFET to FinFET has kept alive Moore's Law to match this evolution of process nodes. However, the technology shift brings additional challenges, one of which is the elimination of thick oxide devices that can handle higher voltages, for example in switching applications. Only thin oxide devices are available in lower technology nodes. For purposes of illustration, to compare sizes of thick and thin oxide devices, the thin oxide pass gate area is considerably less than that of the thick oxide device. For example, a thin oxide 8X pass gate dimension is 0.62×0.45 μm and a corresponding thick oxide 8X pass gate dimension is 1.35×0.56 μm. As another illustration, in a given process, one can create a switch (e.g. pass gate having certain W/L requirements) using only two thick oxide devices, whereas using thin devices a similar switch requires almost 26 devices. This will consume considerably more area compared to using thick oxide devices, so if thick oxide devices are not available, a dynamic switch is used.

Meanwhile, switches are essential blocks in modern analog digitally assisted integrated circuit designs. They find useful application in circuits such as switched capacitor amplifiers, sample and hold circuits, autozero circuits, etc. For example, autozero circuits containing such switches are common in DDR4/5, GDDR6/7 designs. However, if thick oxide devices are used to implement such switches, it can be a challenge to move such designs to lower process nodes.

It is against this technological backdrop that a technological solution to these and other technological issues deeply rooted in this technology was sought.

SUMMARY

The present embodiments relate to electronic devices, and more particularly to an architecture for a switch that can be implemented using only thin oxide devices, even for high voltage applications. As such, in an enable mode, the switch can pass high voltage levels without any reliability concerns. In addition, a switch having an architecture according to embodiments exhibits a low on resistance across the entire input voltage range. Nevertheless, it can fully turn off while the switch is in a disable mode, with very little leakage current. A switch having an architecture according to embodiments can be particularly useful in parallel connection applications where multiple switches are connected in parallel and only one switch is enabled and the other parallel connected switches are disabled.

BRIEF DESCRIPTION OF THE DRAWINGS

These and other aspects and features of the present embodiments will become apparent to those ordinarily skilled in the art upon review of the following description of specific embodiments in conjunction with the accompanying figures, wherein.

DETAILED DESCRIPTION

The present embodiments will now be described in detail with reference to the drawings, which are provided as illustrative examples of the embodiments so as to enable those skilled in the art to practice the embodiments and alternatives apparent to those skilled in the art. Notably, the figures and examples below are not meant to limit the scope of the present embodiments to a single embodiment, but other embodiments are possible by way of interchange of some or all of the described or illustrated elements. Moreover, where certain elements of the present embodiments can be partially or fully implemented using known components, only those portions of such known components that are necessary for an understanding of the present embodiments will be described, and detailed descriptions of other portions of such known components will be omitted so as not to obscure the present embodiments. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the present disclosure is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present embodiments encompass present and future known equivalents to the known components referred to herein by way of illustration.

According to certain aspects, the present embodiments relate to an architecture for a switch that can be implemented using only thin oxide devices, even for high voltage applications. As such, in an enable mode, the switch can pass high voltage levels without any reliability concerns. In addition, a switch having an architecture according to embodiments exhibits a low on resistance across the entire input voltage range. Nevertheless, it can fully turn off while the switch is in a disable mode, with very little leakage current. A switch having an architecture according to embodiments can be particularly useful in parallel connection applications where multiple switches are connected in parallel and only one switch is enabled and the other parallel connected switches are disabled.

Figure 1:
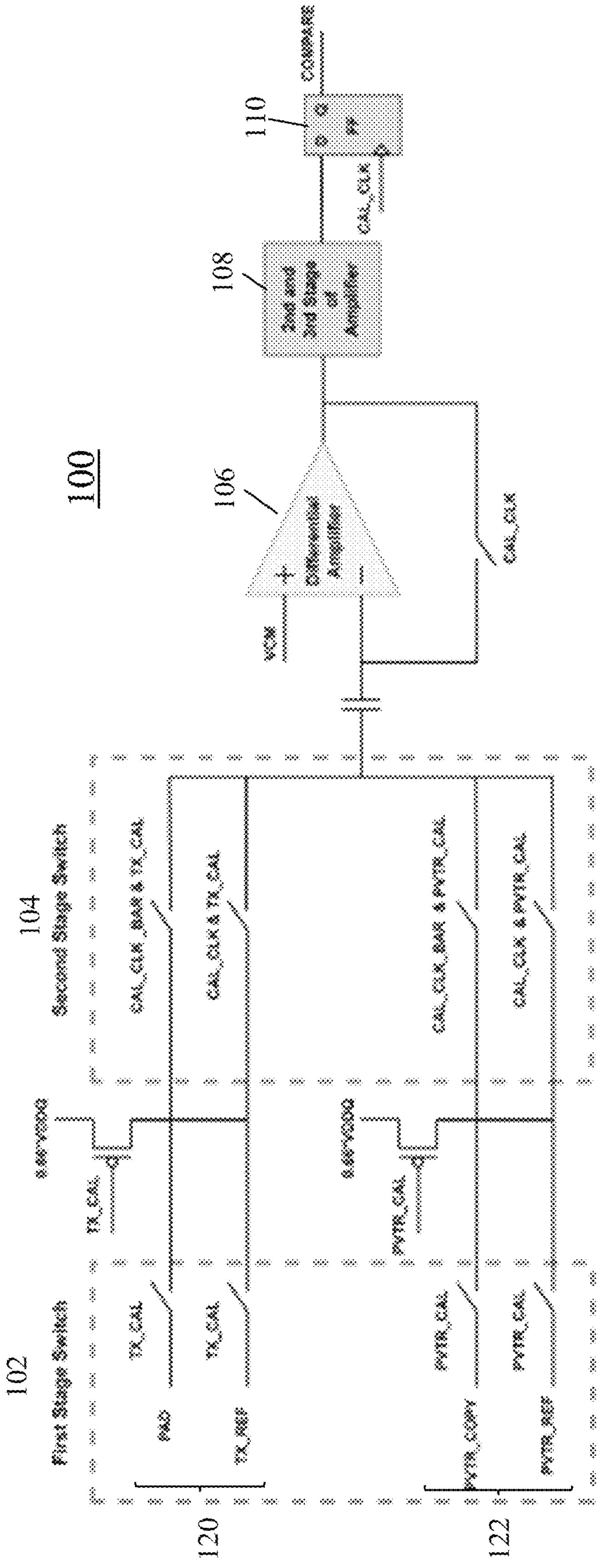
FIG. 1 is a block diagram illustrates an example application of a switch design in a calibration circuit.

FIG. 1 illustrates an example calibration circuit 100 in which switches according to the embodiments can find a useful application. In this example, circuit 100 is used for both transmitter PVT code calibration 120 and regulator resistance calibration 122. More specifically, a common differential amplifier 106 is used for these two different calibrations. When CAL_CLK is selected, amplifier 106 will receive the inputs to be evaluated, and generate an output to amplifier 108, whose output is provided to flop 110. Depending on the evaluation, a COMPARE signal is output, indicating whether the corresponding voltage is calibrated or not.

As shown in FIG. 1, a first stage switch 102 is used to select the output voltage and reference voltage of the block for which calibration is needed. For example, when PVT code calibration 120 is selected, the signal TX_CAL will be asserted, which closes the corresponding switches for passing PAD and TX_REF in switch stage 102. When PVT regulator resistance calibration 122 is selected, the signal PVTR_CAL will be asserted, which closes the corresponding switches for passing PVTR_COPY and PVTR_REF in switch stage 102.

A second stage switch 104 is used to turn on/off calibration using CAL_CLK. While TX_CAL/PVTR_CAL=1 and CAL_CLK=1, the corresponding reference voltage (TX_REF/PVTR_REF) will pass and the calibration circuit is in autozero mode. In the second stage only one switch is turned on at a time and all other switches are turned off. While TX_CAL/PVTR_CAL=1 and CAL_CLK=0, the corresponding voltage to be calibrated (PAD/PVTR_COPY) will pass and the calibration circuit is in evaluation mode.

In general operation of circuit 100, the input PAD voltage can range anywhere from VSS (e.g. 0 volts) to full scale high voltage levels (e.g. VDDQ). In this case, if switch 102 is implemented using standard thin oxide devices, they will be prone to being damaged. Likewise, in a mode when the output of second stage switch 104 is shorted and the input PAD voltage goes up to full scale high voltage levels, if switch 104 is implemented using standard thin oxide switches, they will be prone to being damaged. Another challenge is that the calibration comparator offset is typically less than 2 mV so the switch (e.g. 102/104) should be able pass the input voltage without any drop across the entire voltage range for accurate calibration to be performed.

For these and other reasons, in higher process nodes, thick oxide devices are typically used in applications such as circuit 100. However, these types of devices are not available for use in designs targeted for lower process nodes.

Although a calibration circuit is described herein as one example application, this is not intended to be limiting. Other applications can include switched capacitor amplifiers, sample and hold circuits, autozero circuits, ATB switches etc. Those skilled in the art will appreciate that other possible applications will become apparent after being taught by the present examples.

Moreover, although FIG. 1 illustrates an example where one of two inputs is selected for calibration, the parallel operation is not limited to this number of inputs. For example, there can be two, four, six, or more different inputs that are connected in parallel. In an example where there are six different inputs, the first and second stage switches 102, 104 are preferably configured to enable one input at a time, while disabling the other five inputs.

Figure 2C:
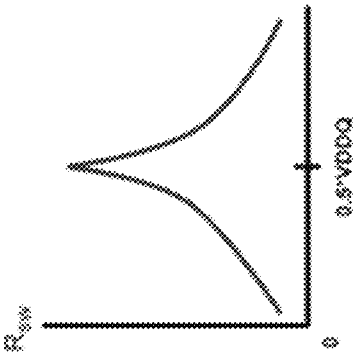
FIGS. 2A to 2C illustrate aspects of a first example switch design.
Figure 2B:
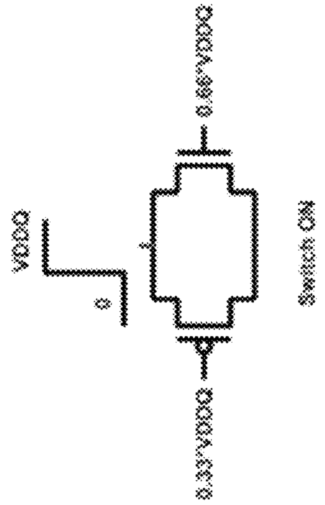
Figure 2A:
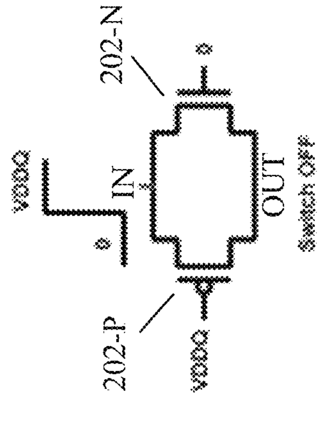

FIGS. 2A to 2C illustrate aspects of a first example switch design 200. Switch design 200 can be used to implement switches in first stage switch 102 and/or second stage switch 104 described in connection with FIG. 1 above.

As shown in this example, switch design 200 has PMOS device 202-P and NMOS device 202-N connected in parallel between an input (IN) and output (OUT).

FIG. 2A shows an example where switch 200 is off. To accomplish turning off switch 200, the PMOS device 202-P is tied to VDDQ and the NMOS device 202-N is tied to 0. Meanwhile, as shown, the voltage at the input can range from 0 to VDDQ. In an off state, the switch 200 should not allow this input voltage to pass to the output.

FIG. 2B shows an example where switch 200 is on. To accomplish turning on the switch 200, the PMOS device 202-P is tied to 0.33*VDDQ and the NMOS device 202-N is tied to 0.66*VDDQ. Meanwhile, as shown, the voltage at an input can range from 0 to VDDQ. In an on state, the switch 200 should allow this input voltage to fully pass to the output.

FIG. 2C is a graph of switch resistance of switch 200 in an on state, which shows that maximum switch resistance occurs when the input voltage is 0.5*VDDQ The present disclosure recognizes and addresses several limitations of this switch design 200. For example, when the switch is in off state, it needs to block a full range of voltages. In the off state, PMOS 202-P is tied to VDDQ and NMOS 202-N is tied to 0. When PAD is changing from 0 to VDDQ and vice versa, the PMOS device 202-P gate to source/drain is VDDQ at PAD=0 and similarly NMOS device 202-P gate to source/drain is VDDQ at PAD=VDDQ. In DDR/GDDR, VDDQ=1.2 and hence VGD/VGS=1.2. This level will stress the devices immensely. Moreover, gate voltage levels lower than VDDQ for PMOS device 202-P and higher than 0 for NMOS device 202-N will not be able to close the switch properly and will result in some leakage voltage from the switch.

To turn on the switch, the gate of PMOS device 202-P is tied to 0.33VDDQ and the gate for NMOS device 202-N is tied to 0.66VDDQ. This can easily pass 0 and VDDQ inputs without any concerns but at 0.5*VDDQ level there will be a dead zone where both PMOS device 202-P and NMOS device 202-N are very weakly ON and hence as shown in FIG. 2C the effective impedance of switch become very high. This will make it difficult to pass the full voltage from the switch.

Hence switch design 200 cannot be used with the higher voltage levels.

Figure 3C:
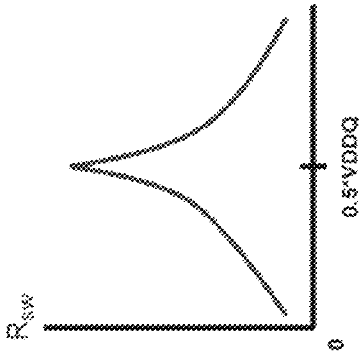
FIGS. 3A to 3C illustrate aspects of a second example switch design.
Figure 3B:
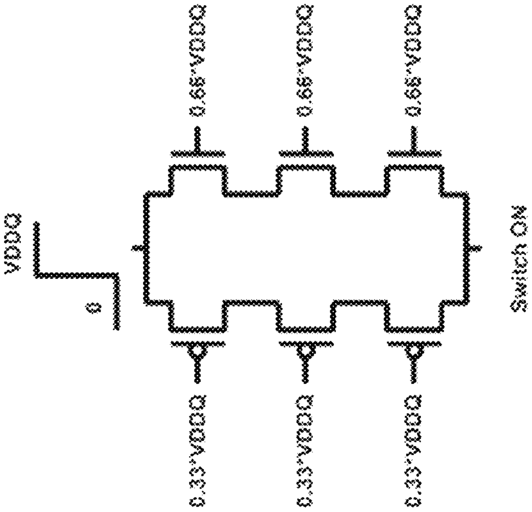
Figure 3A:
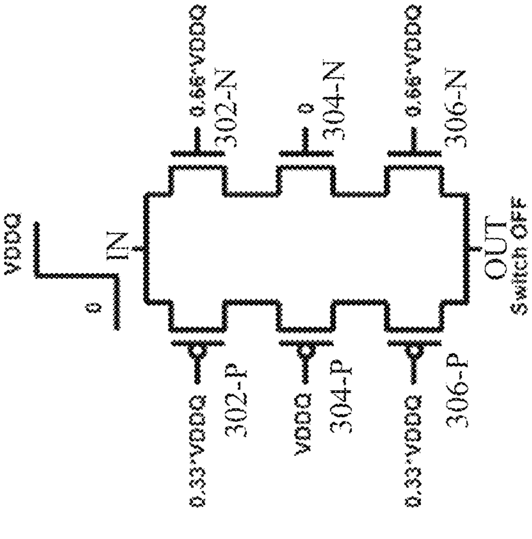

FIGS. 3A to 3C illustrate aspects of a second example switch design 300 that includes a stacking of devices. Switch design 300 can be used to implement switches in first stage switch 102 or second stage switch 104 described in connection with FIG. 1 above. In this example, switch 300 includes stack of PMOS devices 302-P, 304-P and 306-P and a stack of NMOS devices 302-N, 304-N and 306-N. The two stacks are connected in parallel between an input (IN) and an output (OUT).

FIG. 3A illustrates an example where switch 300 is off. In this state, PMOS device 304-P is tied to VDDQ and PMOS devices 302-P and 306-P are tied to 0.33 VDDQ. Also in this state, NMOS device 304-N is tied to 0 and NMOS devices 302-N and 306-N are tied to 0.66 VDDQ.

FIG. 3B illustrates an example where switch 300 is ON. In this state, 0.33VDDQ is tied to the gates for all PMOS devices 302-P, 304-P and 306-P and 0.66VDDQ is tied to the gate of all NMOS devices 302-N, 304-N and 306-N.

FIG. 3C is a graph illustrating switch resistance of switch 300 in an on state. As shown, the switch resistance is at a maximum when the input is 0.5*VDDQ.

The present disclosure recognizes and addresses several limitations of the example switch design 300. For example, in switch OFF mode, the stack protects all devices from voltage stress. All six devices never see a voltage difference more than 0.66*VDDQ but while the two parallel switches are connected as mentioned in FIG. 1, then leakage current is flowing through the disabled device because a leaker is connected between stacked devices to protect the device.

In switch ON mode, 0.33VDDQ is used for the PMOS devices and 0.66VDDQ is used for the NMOS devices. This can easily pass the 0 and VDDQ inputs without any concerns but the same problem arises as with example switch 200, wherein a 0.5*VDDQ level there will be a dead zone where both PMOS and NMOS devices are very weakly ON and hence as shown in FIG. 3C, the effective impedance of switch becomes very high. This will make it difficult to pass full voltage from switch.

Hence the switch design 300 cannot be used to pass full voltage.

Figure 4:
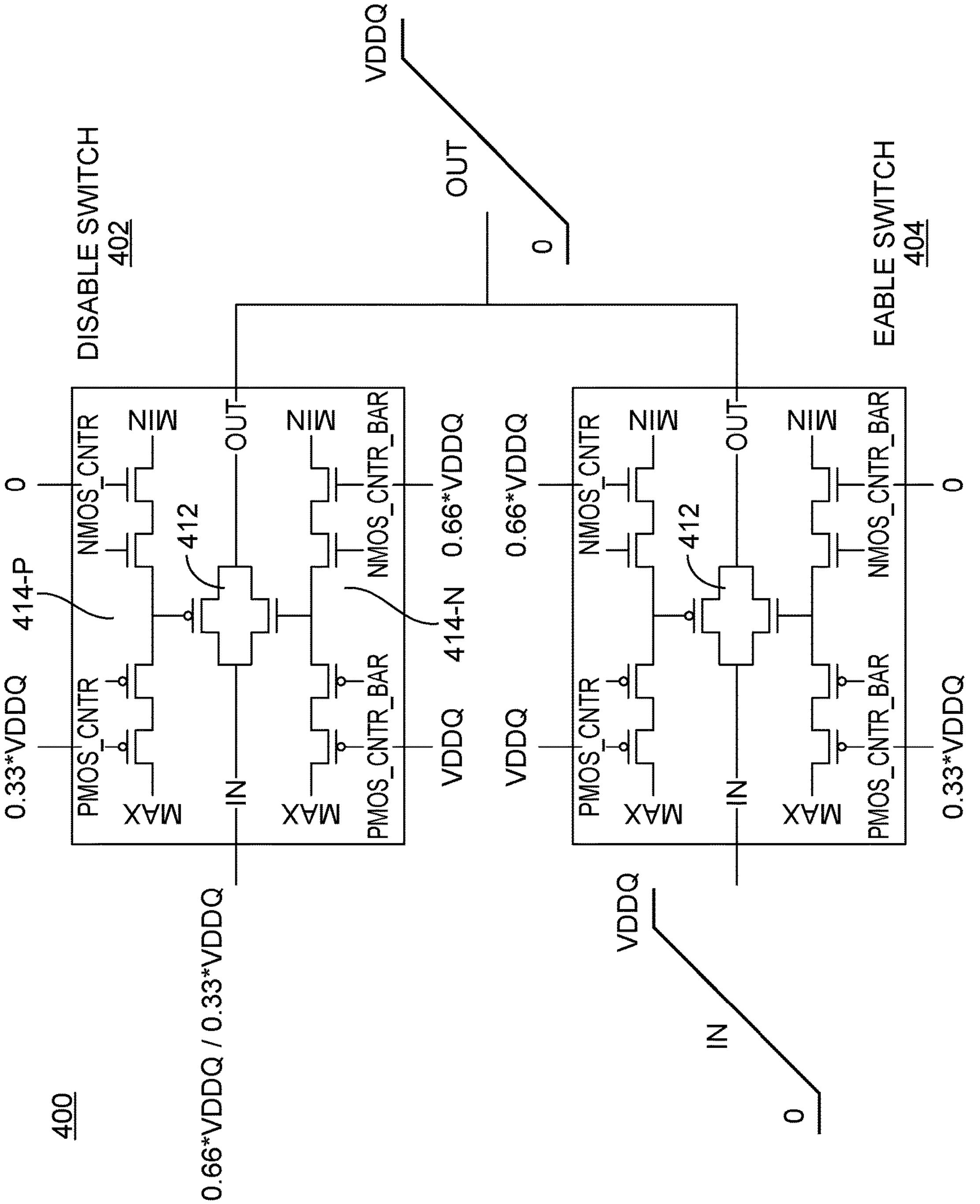
FIG. 4 illustrates aspects of a third possible switch design.

FIG. 4 illustrates aspects of a third possible switch design 400 in which dynamic enable and disable switches are connected in parallel between an input (IN) and output (OUT). Switch design 400 can be used to implement switches in first stage switch 102 or second stage switch 104 described in connection with FIG. 1 above.

As shown in FIG. 4, a disable switch 402 and enable switch 404 are connected in parallel, and only one of which is active at a time. Each switch includes a Max and Min voltage input for controlling a pass gate. These Max/Min voltages are generated based on the input voltage so that in a disable state, the disable switch 402 input needs to be connected either to 0.66*VDDQ or 0.33*VDDQ. In one example, the Min voltage can go from 0 to 0.33*VDDQ and the Max voltage can go from 0.66*VDDQ to VDDQ based on the input voltage of switch 402.

As shown in the example of FIG. 4, both switches 402 and 404 share a common design of a central switch 412 connected between input and output. This central switch 412 can have a design similar to switch design 200 shown in FIG. 2. The PMOS gate of switch 412 is connected to a midpoint of stacked inverter 414-P, one side of which contains stacked PMOS devices connected between the Max input and the midpoint, and the other side of which contains stacked NMOS devices connected between the Min input and the midpoint. Similarly, the NMOS gate of switch 412 is connected to a midpoint of stacked inverter 414-N, one side of which contains stacked PMOS devices connected between the Max input and the midpoint, and the other side of which contains stacked NMOS devices connected between the Min input and the midpoint.

In disable switch 402, the gates of the PMOS devices in stacked inverter 414-P are tied to 0.33*VDDQ and the gates of the NMOS devices are tied to 0. In stacked inverter 414-N, the gates of the PMOS devices are tied to VDDQ and the gates of the NMOS devices are tied to 0.66*VDDQ. In enable switch 404, the gates of the PMOS devices in stacked inverter 414-N are tied to 0.33*VDDQ and the gates of the NMOS devices in stacked inverter 414-N are tied to 0. Similarly, the gates of the PMOS devices in stacked inverter 414-P are tied to VDDQ and the gates of the NMOS devices in stacked inverter 414-P are tied to 0.66*VDDQ.

In an enable state, the switch input can go from 0 to VDDQ and the enable switch 404 passes the full voltage from input to output. The disable switch input voltage is fixed and the output can go from 0 to VDDQ so there can be a voltage difference between input and output, which can stress the devices. Also, the pass gate is not fully off so higher leakage current will pass from the disable switch when the output is near 0 and VDDQ while the disable switch 402 input is connected to 0.66*VDDQ and 0.33*VDDQ respectively.

Figure 5:
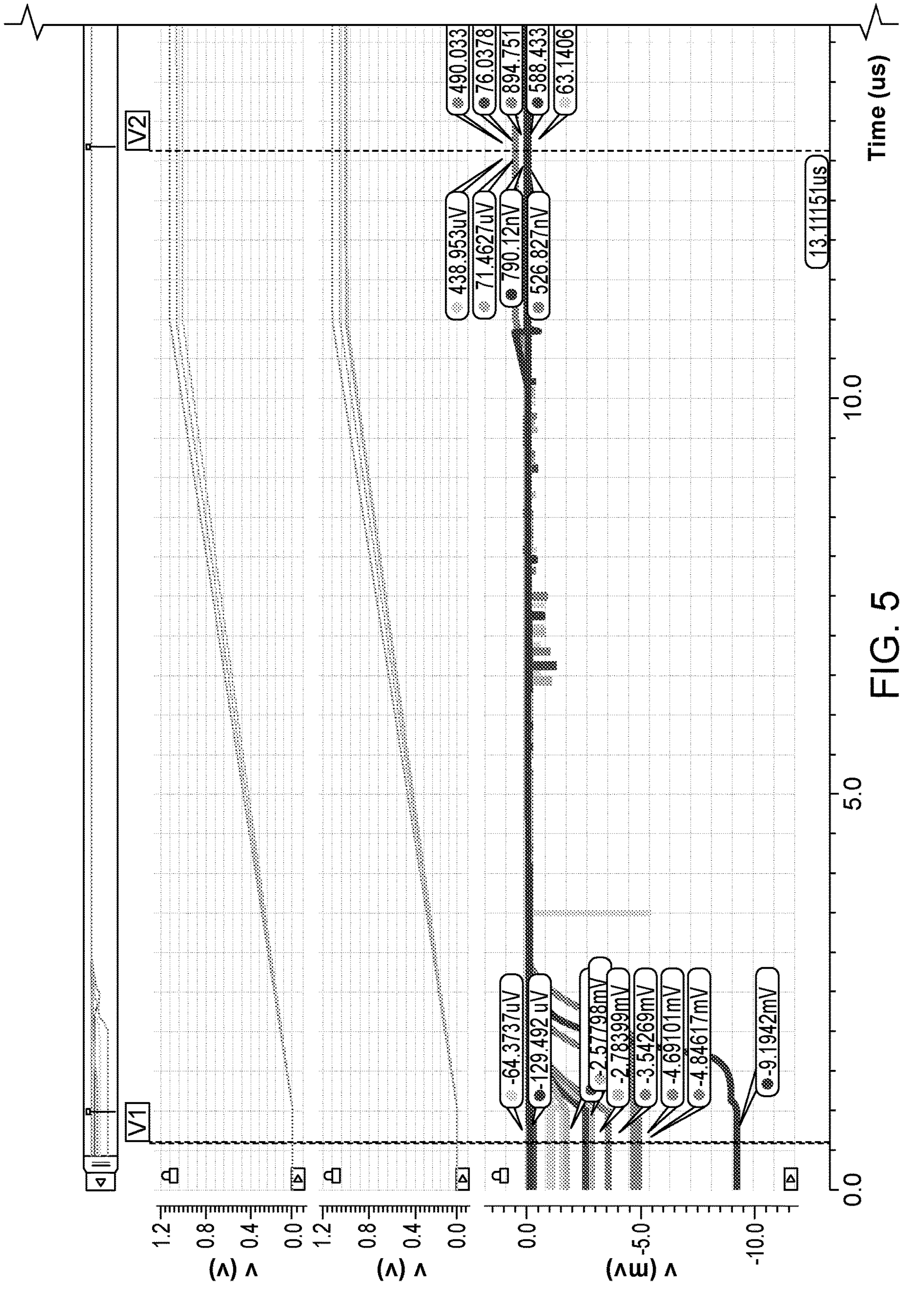
FIG. 5 is a graph illustrating further aspects of third possible switch design.
Figure 5:
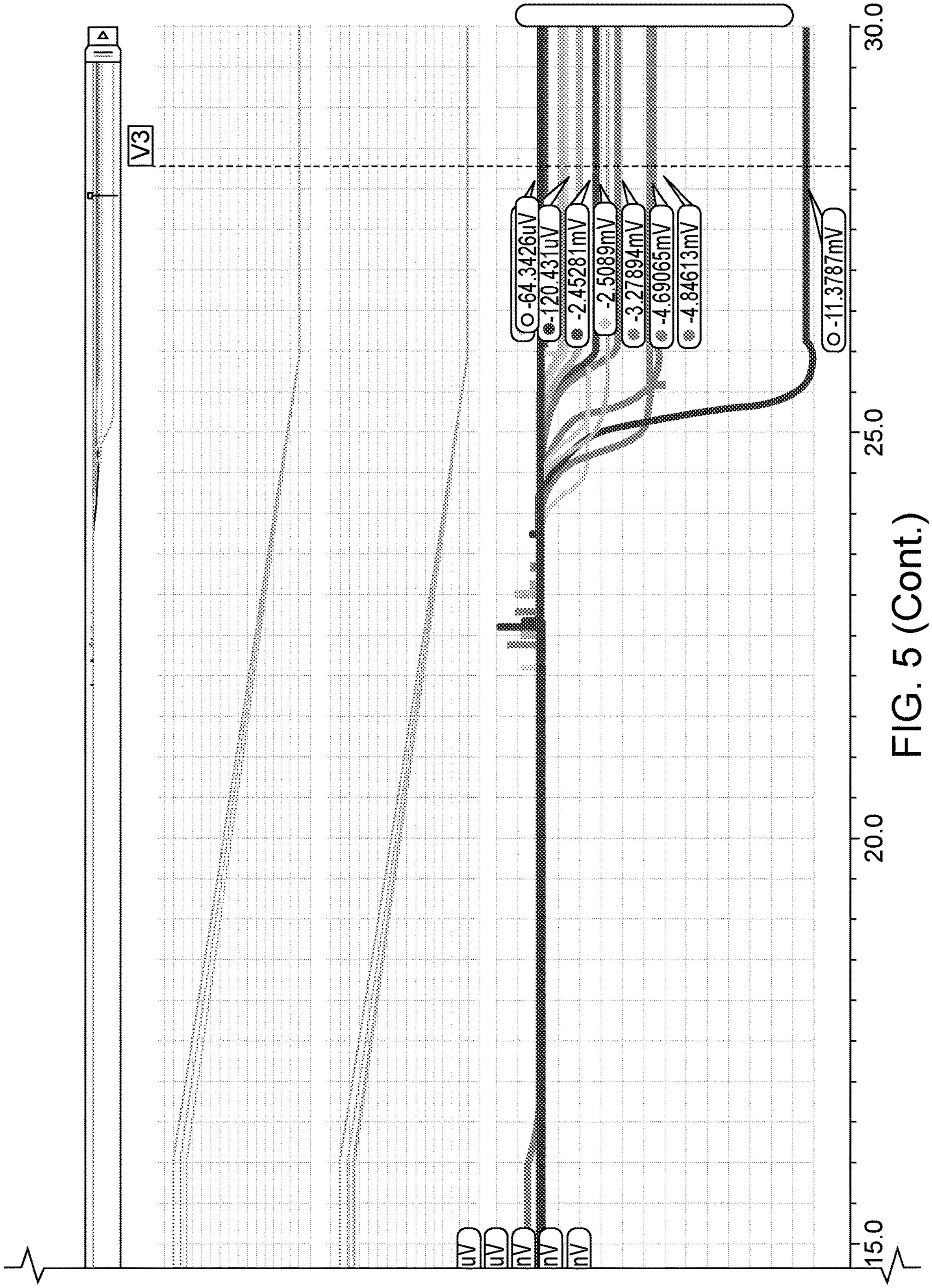

FIG. 5 is a graph illustrating further aspects of third possible switch design 400. More specifically, FIG. 5 provides simulated waveforms generated across 36 PVT corners with an input sweep from 0 to VDDQ. In the simulation, the enable and disable switches are connected in parallel, including one enable and five disable switches.

As shown in transient waveform diagram of FIG. 5, the difference between IN and OUT voltage is 11 mV while the input is near 0 and 490 uV while the input is near VDDQ. A difference of 11 mV is much higher than the comparator offset which can lead to calibration code error. Hence the switch design 400 cannot be used to pass full voltage.

In view of the foregoing, an aspect of the present disclosure is a recognition that a switch design is needed with requirements including: (1) The switch needs to be made of core devices and/or devices that can pass and block higher voltages without stressing the devices; (2) Switch on resistance should be flat across all the range, and rise/fall transition should be smooth; (3) The Ron should meet the more than 99% settling criteria in low speed; (4) Calibration comparator offset is less than 2 mV so the switch should pass input voltage without any drop across the full voltage range for accurate calibration code while certain switch outputs are shorted and other switches are in a disable state.

A switch design according to embodiments includes using Max and Min voltages to control the gate voltages of the MOS devices. According to certain aspects, the MOS devices used are core only, but the design allows for them not to be stressed even with higher level voltages. The Ron is flat across 0 to VDDQ values, even near 0.5*VDDQ, as opposed to the designs described above. The Ron value can easily meet a 99% settling criteria. It allows for passing of input voltage with minimal drop, which further allows for accurate code calibration.

Figure 6:
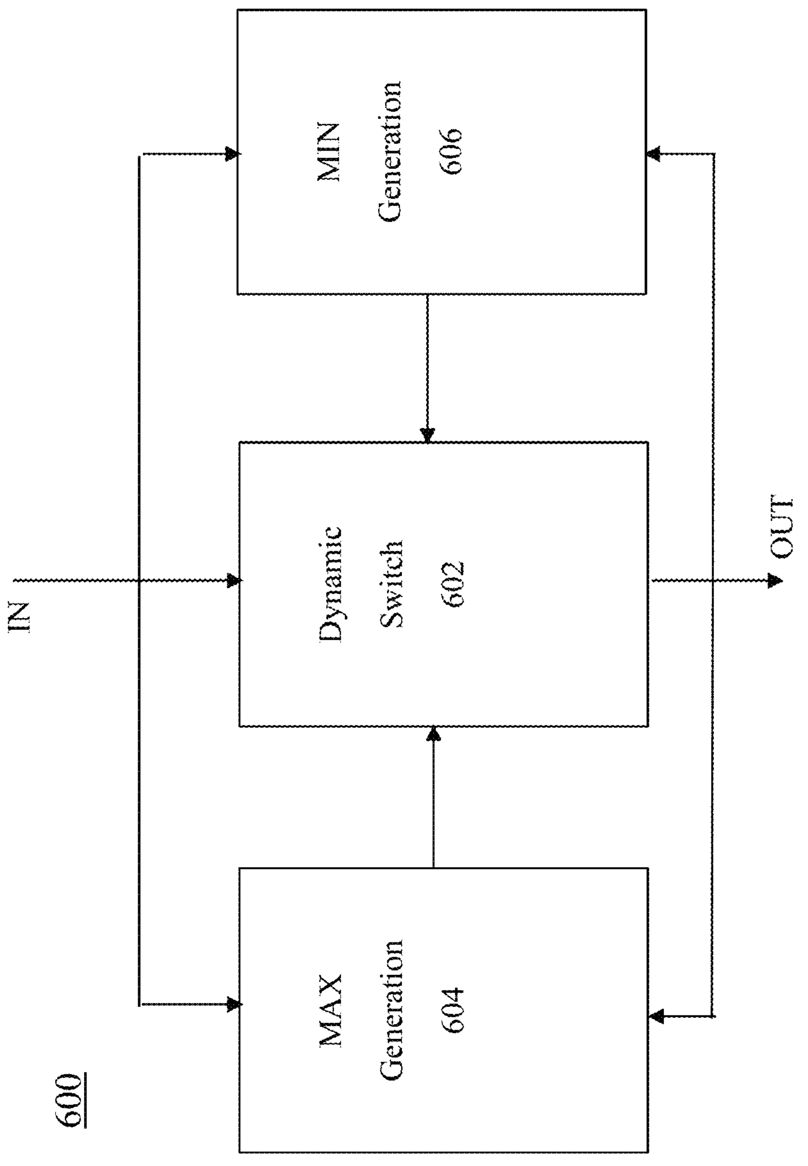
FIG. 6 is a block diagram illustrating an illustrates an example switch architecture according to embodiments.

FIG. 6 is a block diagram illustrating an illustrates an example switch architecture 600 according to embodiments. An aspect of switch 600 is that it can be implemented using thin oxide devices and can be used for parallel connection with multiple other switches 600 in parallel connection applications such as those described above in connection with FIG. 1.

As shown in this example, switch 600 includes a dynamic switch 602 coupled between an input (IN) and an output (OUT). A Max circuit 604 senses the voltages at both the Input and Output nodes and generates a MAX voltage as a function of IN and OUT voltage level. The MAX voltage is provided to the dynamic switch 602 for controlling the switch 602 in disable and enable states as will be described in more detail below. Likewise, a Min circuit 606 senses the voltages at both the Input and Output nodes and generates a MIN voltage as a function of IN and OUT voltage level. The MIN voltage is provided to the dynamic switch 602 for controlling the switch 602 in disable and enable states as will be described in more detail below.

Max circuit 604 generates a MAX voltage based on the sensed IN and OUT voltages according to the following transfer function:

$$\begin{aligned} MAX &= 0.66*VDDQ, \text{ when } \mathrm{Max}(IN, OUT) \le 0.66*VDDQ \\ &= VDDQ, \text{ when } \mathrm{Max}(IN, OUT) > 0.66*VDDQ \end{aligned}.$$

Min circuit 606 generates a MIN voltage based on the sensed IN and OUT voltages according to the following transfer function:

$$\begin{aligned} MIN &= 0, \text{ when } \mathrm{Min}(IN, OUT) \le 0.33*VDDQ \\ &= 0.33*VDDQ, \text{ when } \mathrm{Min}(IN, OUT) > 0.33*VDDQ \end{aligned}$$

The levels 0.66*VDDQ and 0.33*VDDQ are preferably used because these are the highest levels of voltage that can be safely tolerated by thin oxide devices in a given process. So in any transition from 0 to VDDQ or vice-versa, the thin oxide devices will not see more than 0.66*VDDQ voltage across VGS,VDG,VDS. This safely keeps all devices from stressing while maintaining very good Ron values.

Figure 7:
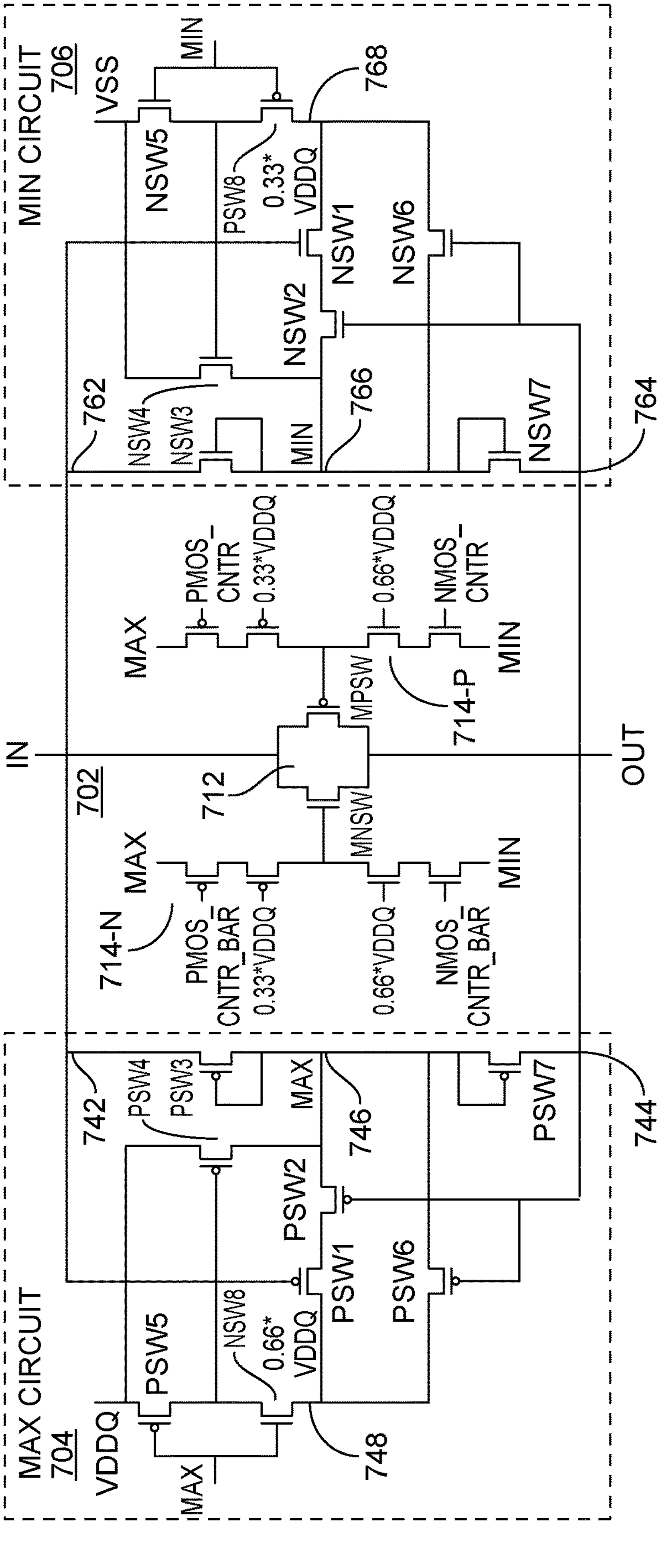
FIG. 7 illustrates an example switch including thin oxide core devices in accordance with the architecture illustrated in FIG. 6 according to embodiments.

FIG. 7 illustrates an example switch including thin oxide core devices in accordance with the architecture illustrated in FIG. 6. In accordance with the architecture of FIG. 6, switch 700 includes Max circuit 704, Min circuit 706, and dynamic switch 702 coupled between an input (IN) and output (OUT).

In this example switch 700, dynamic switch 702 can be similar to switch 400 as described above. For example, switch 702 includes a central switch 712 connected between the switch input (IN) and output (OUT). The PMOS gate of switch 712 is connected to a midpoint of stacked inverter 714-P, one side of which contains stacked PMOS devices connected between the Max input and the midpoint, and the other side of which contains stacked NMOS devices connected between the Min input and the midpoint. Similarly, the NMOS gate of switch 712 is connected to a midpoint of stacked inverter 714-N, one side of which contains stacked PMOS devices connected between the Max input and the midpoint, and the other side of which contains stacked NMOS devices connected between the Min input and the midpoint.

As described above, Max circuit 704 generates a Max voltage at node 746 based on sensed voltages present on the input (IN) and output (OUT) of switch 700 received at nodes 742 and 744, respectively, as well as a fixed input 0.66*VDDQ at node 748. It includes a PMOS device PSW1 having its gate tied to IN, and PMOS devices PSW2 and PSW6 having gates tied to OUT. PSW1 and PSW2 are also connected between node 748 and MAX node 746. A PMOS device PSW3 has its gate tied to MAX and is also connected between IN node 742 and MAX node 746. A PMOS device PSW7 also has its gate tied to MAX and is connected between OUT node 744 and MAX node 746. A PMOS device PSW4 is connected between VDDQ and MAX node 746. A PMOS device PSW5 and a NMOS device NSW8 have gates tied to MAX and are connected in series between VDDQ and node 748, with their midpoint connected to the gate of PSW4.

As further described above, Min circuit 706 generates a Min voltage at node 766 based on sensed voltages present on the input (IN) and output (OUT) of switch 700 received at nodes 762 and 764, respectively, as well as a fixed input 0.33*VDDQ at node 768. It includes a NMOS device NSW1 having its gate tied to IN, and NMOS devices NSW2 and NSW6 having gates tied to OUT. NSW1 and NSW2 are also connected between node 768 and MIN node 766. A NMOS device NSW3 has its gate tied to MIN and is also connected between IN node 762 and MIN node 766. A NMOS device NSW7 also has its gate tied to MIN and is connected between OUT node 764 and MIN node 766. A NMOS device NSW4 is connected between VSS and MIN node 746. A NMOS device NSW5 and a PMOS device PSW8 have gates tied to MIN and are connected in series between VSS and node 768, with their midpoint connected to the gate of NSW4.

Figure 8B:
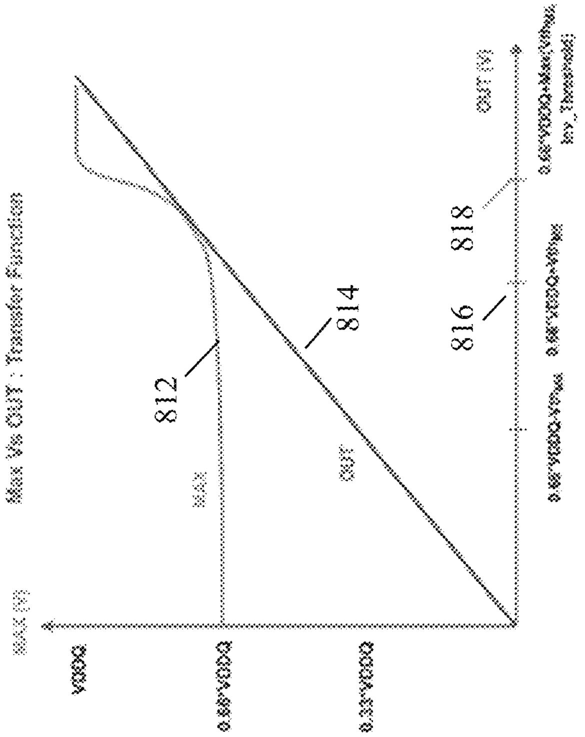
FIGS. 8A and 8B are graphs illustrating example transfer functions of the MAX voltage generated by MAX circuit 704 in FIG. 7 according to embodiments.
Figure 8A:
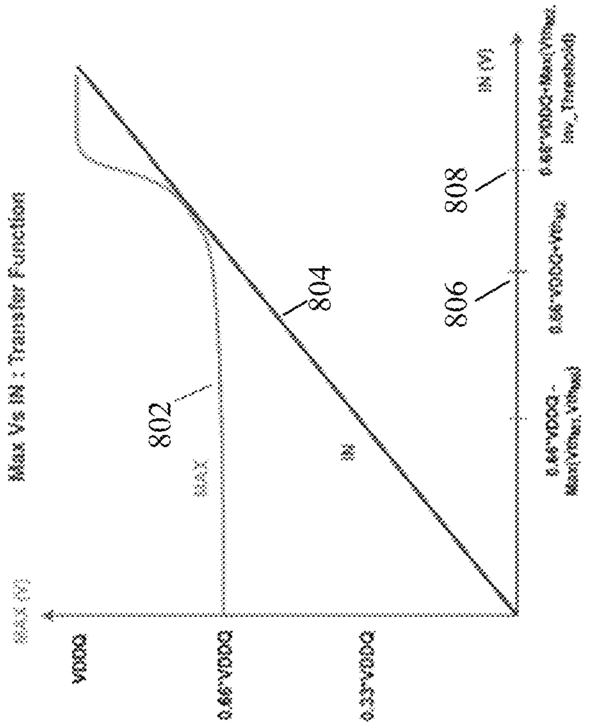

Transfer functions of the MAX voltage generated by MAX circuit 704 based on IN and OUT voltages are shown in FIGS. 8A and 8B. As will be described in more detail below, the generated MAX voltage can be used to turn OFF the PMOS of central switch 712 under certain conditions and MAX can be used to turn ON the NMOS of central switch 712 under certain conditions.

In general, the generated MAX voltage is always greater than either IN or OUT and also always greater than or equal to 0.66*VDDQ. FIG. 8A illustrates a transfer function between values of the IN voltage 804 and the MAX voltage 802 generated by MAX circuit 704. As shown, for low voltages of IN, the MAX voltage is 0.66*VDDQ. When IN raises to about 0.66*VDDQ, MAX transitions to a level of VDDQ, and remains there for levels of IN greater than about 0.66*VDDQ+Max (VthM2, Inv_Threshold). Similarly, FIG. 8B illustrates a transfer function between values of the OUT voltage 814 and the MAX voltage 812 generated by MAX circuit 704. As shown, for low voltages of OUT, the MAX voltage is 0.66*VDDQ. When OUT raises to about 0.66*VDDQ, MAX transitions to a level of VDDQ, and remains there for levels of OUT greater than about 0.66*VDDQ+Max (VthM5, Inv_Threshold).

According to certain aspects of embodiments of MAX circuit 704, if the switch 700 is in a disabled state, then IN is connected to 0.66*VDDQ and OUT can go from 0 to VDDQ. In this case the MAX voltage generated by circuit 704 using IN is at least a constant 0.66* VDDQ and the PMOS gate of switch 712 is 0.66*VDDQ. As OUT rises above 0.66*VDDQ+VthPMOS, then leakage current may flow from OUT to IN because the PMOS of switch 712 is ON. However, in the present MAX circuit 704, the MAX voltage is generated also using OUT. So as OUT rises above 0.66*VDDQ, the generated MAX voltage is also equal to or greater than OUT, which ensures that the PMOS of switch 712 will not turn ON and leakage current will not flow.

Figure 9A:
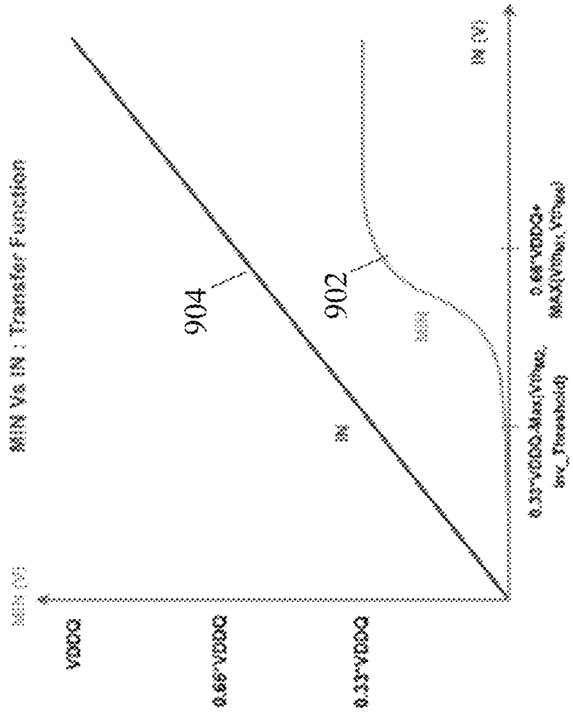
FIGS. 9A and 9B are graphs illustrating example transfer functions of the MIN voltage generated by MIN circuit 706 in FIG. 7 according to embodiments.
Figure 9B:
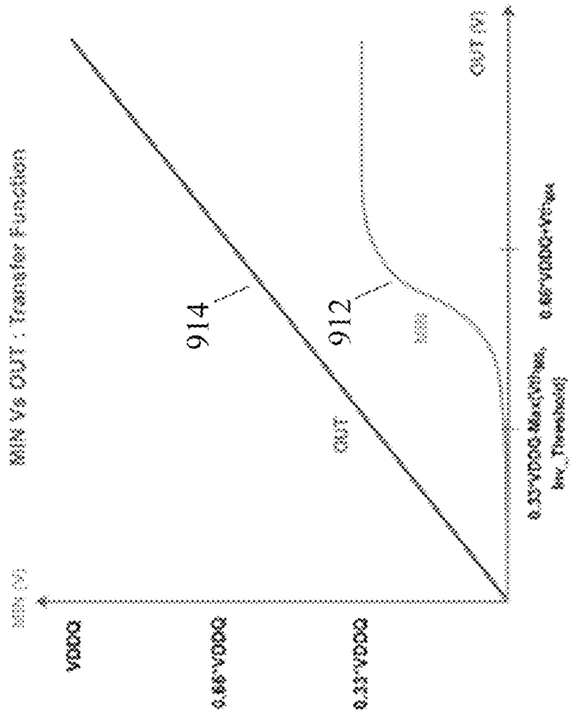

Transfer functions of the MIN voltage generated by MIN circuit 706 based on IN and OUT voltages are shown in FIGS. 9A and 9B. As will be described in more detail below, the generated MIN voltage can be used to turn OFF the NMOS of central switch 712 under certain conditions and MIN can be used to turn ON the PMOS of central switch 712 under certain conditions.

In general, the generated MIN voltage is always greater than either IN or OUT and also always less than or equal to 0.33*VDDQ. FIG. 9A illustrates a transfer function between values of the IN voltage 904 and the MIN voltage 902 generated by MIN circuit 706. As shown, for low voltages of IN, the MIN voltage is 0. When IN raises to about 0.33*VDDQ-Max (VthM2, Inv_Threshold), MIN transitions to a level of 0.33*VDDQ, and remains there for levels of IN greater than about 0.66*VDDQ+Max (VthM1, VthM6). Similarly, FIG. 9B illustrates a transfer function between values of the OUT voltage 914 and the MIN voltage 912 generated by MIN circuit 706. As shown, for low voltages of OUT, the MIN voltage is 0. When OUT raises to about 0.33*VDDQ-Max (VthM5, Inv_Threshold), MIN transitions to a level of 0.33*VDDQ, and remains there for levels of OUT greater than about 0.66*VDDQ+VthM4.

According to certain aspects of embodiments of MIN circuit 706, when switch 700 is in a disabled state then IN is connected to 0.66*VDDQ and OUT can go from VDDQ to 0. In this case, the MIN voltage generated by circuit 706 using IN is a constant 0.33*VDDQ and the NMOS gate of switch 712 is tied to 0.33*VDDQ. If OUT goes below 0.33*VDDQ+VthNMOS, then leakage current may flow from IN to OUT by virtue of the NMOS of switch 712 being ON. However, due to the design of MIN circuit 706, the MIN voltage is generated using OUT also. So if OUT goes below 0.33*VDDQ, then the generated MIN voltage is also the same or less than OUT. Accordingly, the NMOS of switch 712 will not turn ON and leakage current will not flow.

Figure 10:
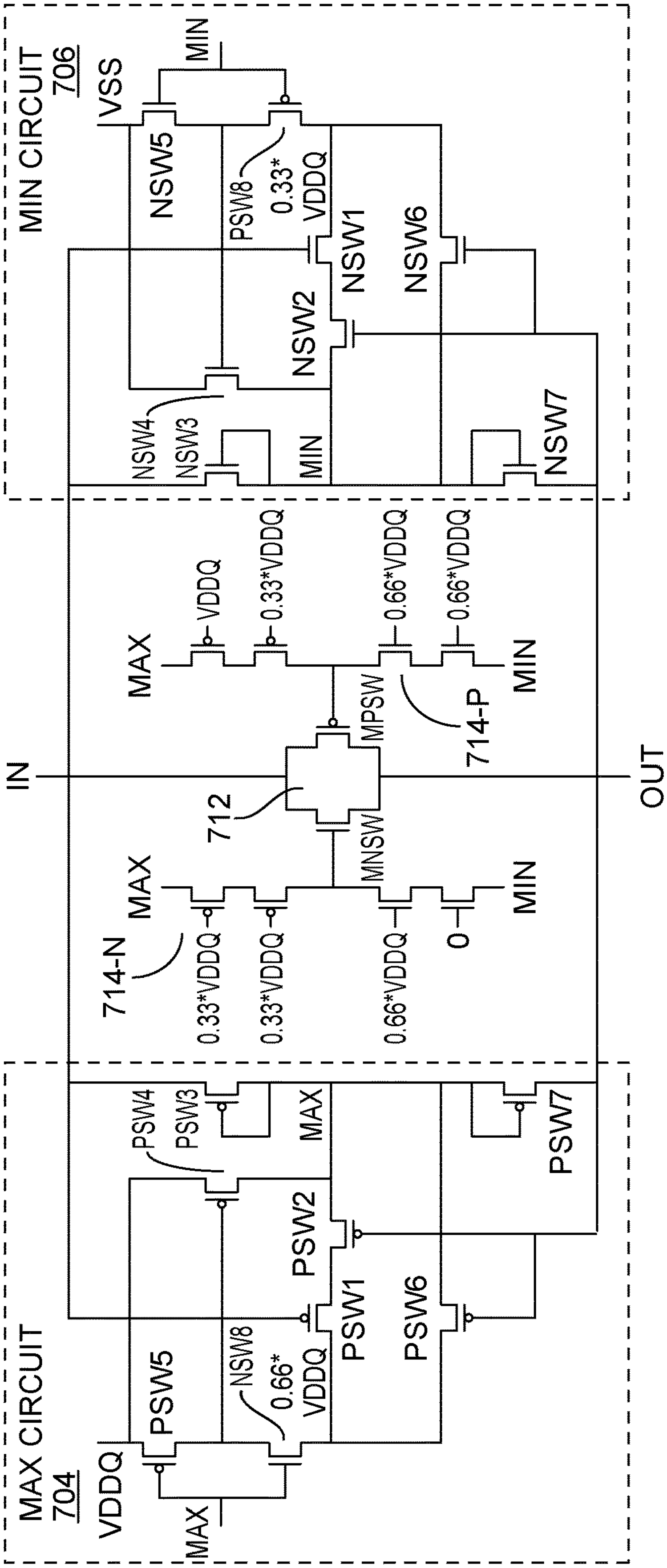
FIG. 10 illustrates an example operation of a switch according to embodiments in an enabled state.

FIG. 10 illustrates an example operation of a switch according to embodiments in an enabled state.

In an enabled state of switch 700, the PMOS gate of central switch 712 is controlled using the generated MIN voltage and the NNOS gate of switch 712 is controlled using the generated MAX voltage. As further shown in an enable state, the PMOS gates of stacked inverter 714-N are tied to 0.33*VDDQ, while one NMOS gate of stacked inverter 714-N is tied to 0.66*VDDQ and the other NMOS gate of stacked inverter 714-N is tied to 0. Similarly, the NMOS gates of stacked inverter 714-P are tied to 0.66*VDDQ, while one PMOS gate of stacked inverter 714-P is tied to 0.33*VDDQ and the other PMOS gate of stacked inverter 714-P is tied to VDDQ.

First consider rising values of IN. When IN is at 0, the PSW1 and PSW2 of MAX circuit 704 causes MAX to be 0.66*VDDQ. Similarly, when OUT is at 0, the PSW6 of MAX circuit 704 causes MAX to be 0.66*VDDQ. So the NMOS gate of switch 712 will be at 0.66*VDDQ and the source will be at 0. This makes the NMOS of switch 712 turn on. A stacked inverter is used to pass the MAX voltage to the NMOS gate of switch 712. As a result, logic 0 can easily pass through the NMOS of switch 712 and to the output (OUT).

When IN reaches 0.66*VDDQ-Max (Vth_PSW1, Vth_PSW2), the PSW1 and PSW2 of MAX circuit 704 are OFF and PSW3 will turn on. Similarly when OUT is at 0.66*VDDQ-Vth_PSW6, the PSW6 of MAX circuit 704 is OFF and PSW7 will turn on. If PSW3 turns on early then MAX will start following IN and if PSW7 turn on early then MAX will start following OUT. Here, MAX will follow the higher voltage of IN and OUT.

When IN reaches 0.66*VDDQ+Max (Vth_PSW3, Inverter_threshold), this will trigger the NSW8 of MAX circuit 704 and cause PSW4 switching of MAX to VDDQ. Similarly, as OUT reaches 0.66*VDDQ+Max (Vth_PSW7, Inverter_threshold), this will trigger the NSW8 of MAX circuit 704 and cause PSW4 switching of MAX to VDDQ. MAX thus reaches VDDQ before IN/OUT reaches VDDQ. So the higher voltage of either IN or OUT will trigger NSW8 and cause PSW4 switching of MAX to VDDQ. This makes the NMOS of switch 712 completely switch off at VDDQ. A logic High will be passed through the PMOS of switch 712 anyway. Similar to IN/OUT rising from 0 to VDDQ, when it falls from VDDQ to 0 the same transitions happen. Accordingly, the NMOS of switch 712 will pass the logic low levels of IN to the output (OUT).

Now consider falling values of IN. When IN is at VDDQ, the NSW1 and NSW2 of MIN circuit 706 causes MIN to be 0.33*VDDQ. Similarly when OUT is at VDDQ, the NSW6 of circuit 706 causes MIN to be 0.33*VDDQ. So the PMOS gate of switch 712 will be at 0.33*VDDQ and the source will be at VDDQ. This turns on the PMOS of switch 712. A stacked inverter is used to PASS the generated MIN voltage to the PMOS gate of switch 712. A Logic high at the input (IN) can thus easily pass through the PMOS device of switch 712 to the output (OUT).

When IN falls below 0.33*VDDQ+Max (Vth_NSW1, Vth_NSW2) the NSW1 and NSW2 of MIN circuit 706 will turn OFF and MIN will decrease. Similarly as OUT falls below 0.33*VDDQ+Vth_NSW6 the NSW6 of MIN circuit 7096 will turn OFF and MIN will decrease. Once IN falls below 0.33*VDDQ-Max (Vth_NSW3, Inverter_threshold), this will triggers the PSW8 of MIN circuit 706 and causes NSW4 switching of VSS to MIN. Similarly, as OUT falls below 0.33*VDDQ-Max (Vth_NSW7, Inverter_threshold), this will trigger the PSW8 of MIN circuit 706 and causes NSW4 switching of VSS to MIN. MIN is therefore at VSS before IN/OUT reaches VSS. Here, the lower voltage of either IN or OUT will trigger the PSW8 of MIN circuit 706 and cause NSW4 switching of VSS to MIN. This causes the PMOS of switch 712 to completely switch off at VSS. A logic low will be passed through the NMOS of switch 712.

Similar to IN/OUT falling from VDDQ to 0, when it goes from 0 to VDDQ the same transitions happen. The PMOS of gate 712 will pass the logic high levels. The design of circuit 700 is such that when IN is rising and is at 0.5*VDDQ, MAX is rapidly approaching towards VDDQ and MIN is slowly reaching to 0.33*VDDQ. Accordingly, there will be enough overdrive for both the NMOS and PMOS devices of switch 712 to pass 0.5*VDDQ levels. Similarly, when IN is falling and is at 0.5*VDDQ, MAX is slowly approaching to 0.66*VDDQ and MIN is rapidly approaching to 0. So there will be enough overdrive for the NMOS and PMOS devices of switch 712 to pass 0.5*VDDQ levels, thereby overcoming the Ron problem of previous approaches.

Figure 11:
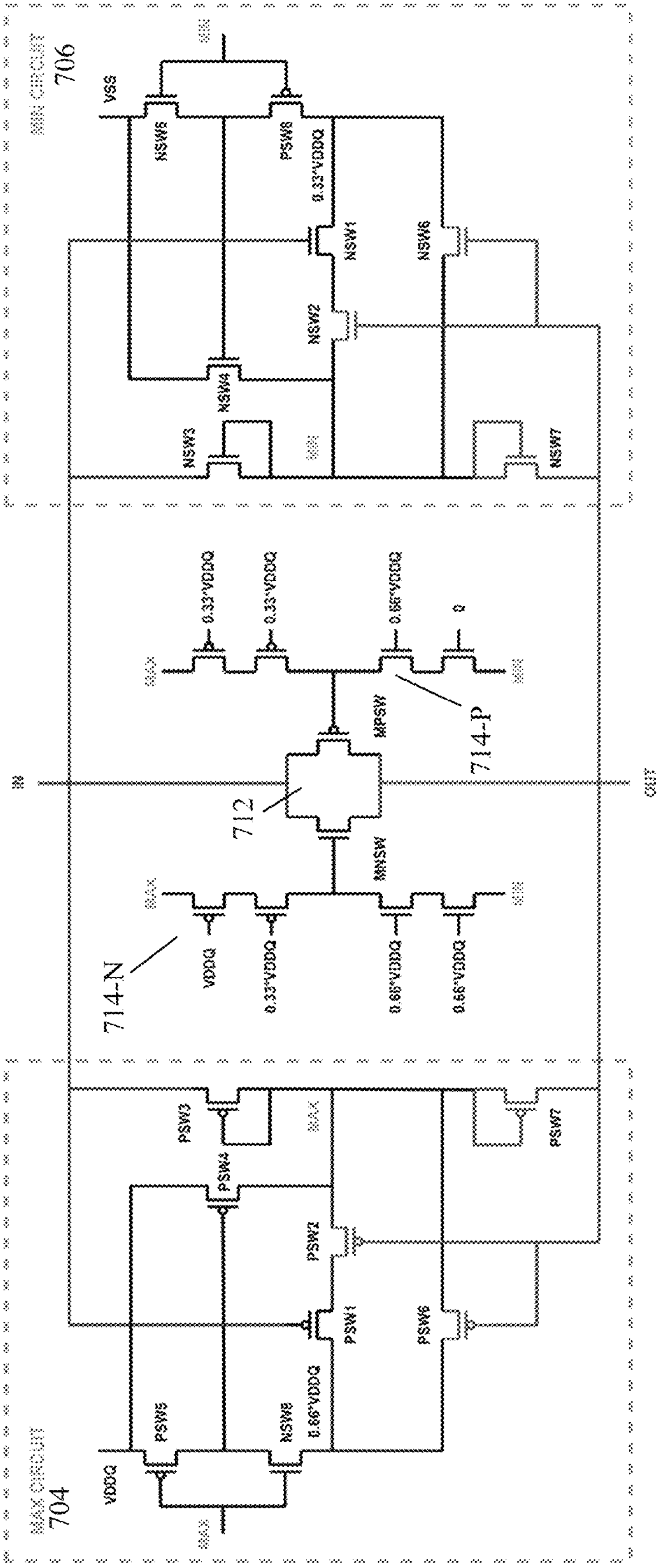
FIG. 11 illustrates an example operation of a switch according to embodiments in a disabled state.

FIG. 11 illustrates an example operation of a switch according to embodiments in a disabled state.

In a disabled state of switch 700, the PMOS gate of central switch 712 is controlled using the generated MAX voltage and the NMOS gate of switch 712 is controlled using the generated MIN voltage. As further shown in a disable state, the PMOS gates of stacked inverter 714-P are tied to 0.33*VDDQ, while one NMOS gate of stacked inverter 714-P is tied to 0.66*VDDQ and the other NMOS gate of stacked inverter 714-P is tied to 0. Similarly, the NMOS gates of stacked inverter 714-N are tied to 0.66*VDDQ, while one PMOS gate of stacked inverter 714-N is tied to 0.33*VDDQ and the other PMOS gate of stacked inverter 714-N is tied to VDDQ.

When switch 700 is in a disabled state, the input is connected to a fixed voltage of either 0.33*VDDQ or 0.66*VDDQ.

During operation of switch 700 a disable state, when IN is 0.33*VDDQ/0.66*VDDQ, the MAX voltage generated by circuit 704 is fixed at 0.66*VDDQ due to the input voltage transfer function. But once the OUT voltage rises above 0.66*VDDQ, the generated MAX voltage by circuit 704 will start to follow OUT. As explained above, over about 0.66*VDDQ values of OUT, the MAX voltage will go from 0.66*VDDQ to VDDQ based on the OUT voltage and the PMOS gate voltage of central switch 712 is always more than the source/drain voltage, which will prevent leakage current through the NMOS device.

Similarly when IN is at 0.33*VDDQ/0.66*VDDQ, MIN voltage generated by circuit 706 is fixed at 0.33*VDDQ due to the input voltage transfer function. But once the OUT voltage falls below 0.33*VDDQ, MIN voltage generated by circuit 706 will start to follow OUT. As explained above, the MIN voltage falls from 0.33*VDDQ to 0 based on the OUT voltage and the NMOS gate voltage of central switch 712 is always less than the source/drain voltage which will prevent leakage current through the NMOS device.

The design of switch 700 according to embodiments is such that for any IN/OUT voltage, the MAX voltage of switch 700 in a disable mode is always more than IN/OUT voltage, the MIN voltage of switch 700 is always less than the IN/OUT voltage.

Figure 12:
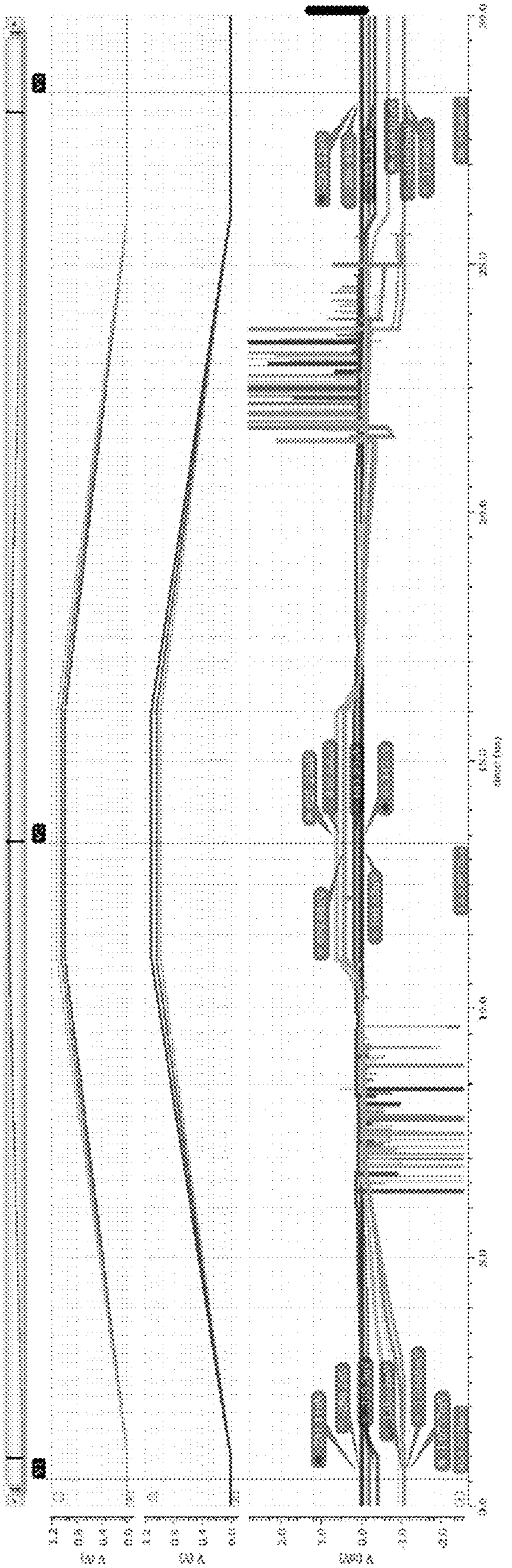
FIG. 12 is a waveform diagram illustrating further example aspects of switch design 700 according to embodiments.

FIG. 12 is a waveform diagram illustrating further aspects of switch design 700 according to embodiments. More specifically, FIG. 12 provides simulated waveforms generated across 36 PVT corners with an input sweep from 0 to VDDQ. In the simulation, six switches implemented by design 700 are connected in parallel, wherein one switch is enabled and five switches are disabled. As shown in transient waveform diagram of FIG. 12, the difference between IN and OUT voltage is 1 mV while IN is around 0/VDDQ and 625 uV while IN is around VDDQ/2. Even with six switches connected in parallel, the enable switch is able to pass full voltage across all PVT corners.

Figure 13:
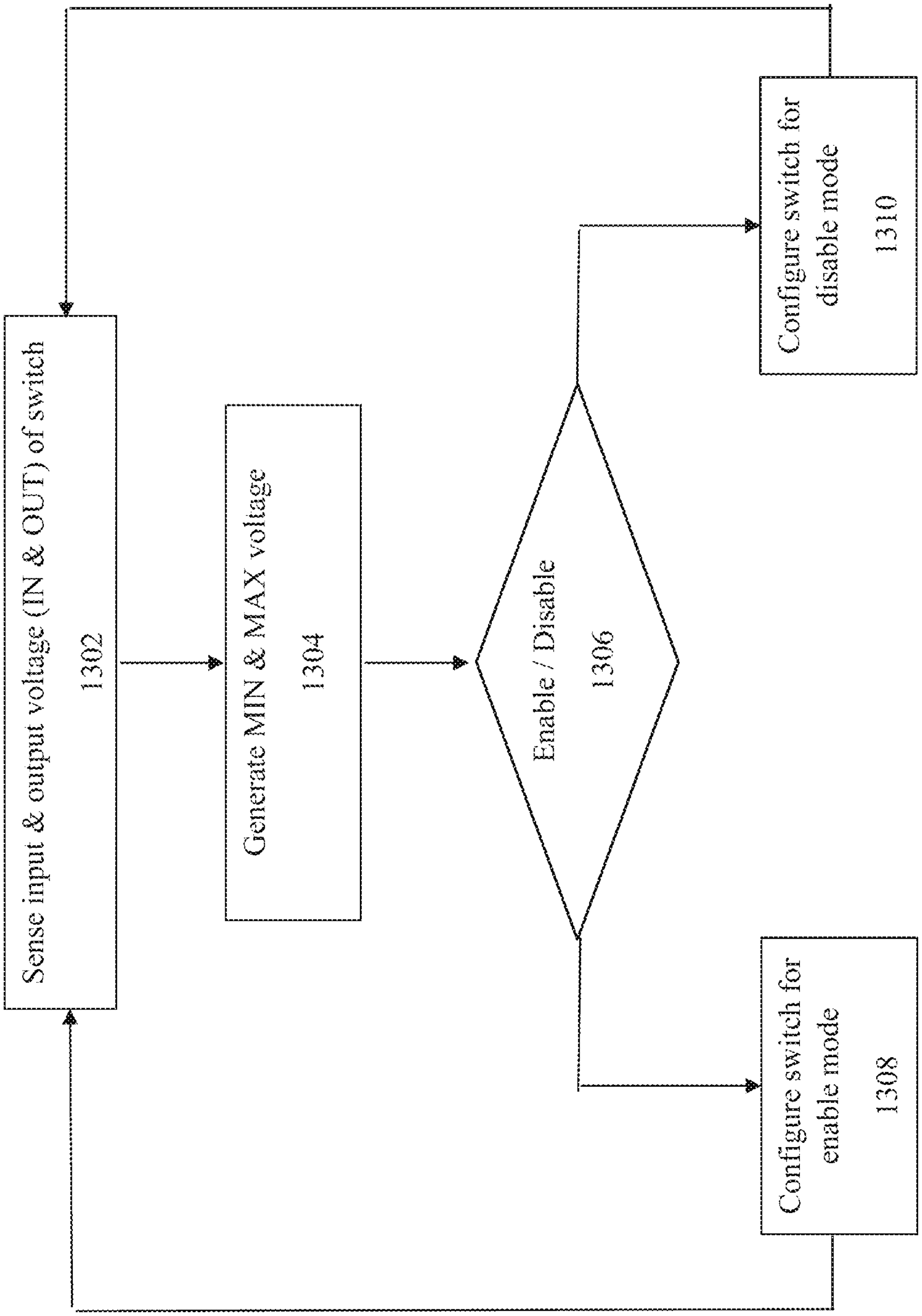
FIG. 13 is a flowchart illustrating an example methodology of operating a switch according to embodiments.

FIG. 13 is a flowchart illustrating an example operational methodology of a switch design according to embodiments.

As shown in this example, a first block 1302 includes sensing the voltages at the input (IN) and an output (OUT) of the switch. As described above, these sensed voltages are used by Max and Min circuits for generating corresponding Max and Min voltages.

Accordingly, a next block 1304 includes generating MAX and MIN voltages as a function of the sensed IN and OUT voltage levels from 1302. For example, block 1304 includes generating a MAX voltage based on the sensed IN and OUT voltages according to the following transfer function:

$$\begin{aligned} \text{MAX} &= 0.66 * VDDQ, \text{ when Max(IN, OUT)} \le 0.66 * VDDQ \\ &= VDDQ, \text{ when Max(IN, OUT)} > 0.66 * VDDQ \end{aligned}$$

Moreover, block 1304 includes generating a MIN voltage based on the sensed IN and OUT voltages according to the following transfer function:

$$\begin{aligned} \text{MIN} &= 0, \text{ when Min(IN, OUT)} \le 0.33 * VDDQ \\ &= 0.33 * VDDQ, \text{ when Min(IN, OUT)} > 0.33 * VDDQ \end{aligned}$$

The levels 0.66*VDDQ and 0.33*VDDQ are preferably used because these are the highest levels of voltage that can be safely tolerated by thin oxide devices in a given process. So in any transition from 0 to VDDQ or vice-versa, the thin oxide devices will not see more than 0.66*VDDQ voltage across VGS,VDG,VDS. This safely keeps all devices from stressing while maintaining very good Ron values.

A next block 1306 includes preparing the switch for either an enable mode or a disable mode, depending on whether the switch is to pass an input voltage or to be turned off, respectively.

If the switch is to be enabled, block 1308 is performed. In the example switch design 700, block 1308 includes configuring the PMOS gate of central switch 712 to be controlled using the generated MIN voltage and the NMOS gate of switch 712 to be controlled using the generated MAX voltage. Block 1308 further includes tying the PMOS gates of stacked inverter 714-N to 0.33*VDDQ, while one NMOS gate of stacked inverter 714-N is tied to 0.66*VDDQ and the other NMOS gate of stacked inverter 714-N is tied to 0. Similarly, block 1308 includes tying the NMOS gates of stacked inverter 714-P to 0.66*VDDQ, while one PMOS gate of stacked inverter 714-P is tied to 0.33*VDDQ and the other PMOS gate of stacked inverter 714-P is tied to VDDQ.

If the switch is to be disabled, block 1310 is performed. In the example switch design 700, block 1310 includes configuring the PMOS gate of central switch 712 to be controlled using the generated MAX voltage and the NMOS gate of switch 712 to be controlled using the generated MIN voltage. Block 1310 further includes tying the PMOS gates of stacked inverter 714-P to 0.33*VDDQ, while one NMOS gate of stacked inverter 714-P is tied to 0.66*VDDQ and the other NMOS gate of stacked inverter 714-P is tied to 0. Similarly, block 1310 includes tying the NMOS gates of stacked inverter 714-N to 0.66*VDDQ, while one PMOS gate of stacked inverter 714-N is tied to 0.33*VDDQ and the other PMOS gate of stacked inverter 714-N is tied to VDDQ.

The herein described subject matter sometimes illustrates different components contained within, or connected with, different other components. It is to be understood that such depicted architectures are illustrative, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably coupleable," to each other to achieve the desired functionality. Specific examples of operably coupleable include but are not limited to physically mateable and/or physically interacting components and/or wirelessly interactable and/or wirelessly interacting components and/or logically interacting and/or logically interactable components.

With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

Although the figures and description may illustrate a specific order of method steps, the order of such steps may differ from what is depicted and described, unless specified differently above. Also, two or more steps may be performed concurrently or with partial concurrence, unless specified differently above. Such variation may depend, for example, on the software and hardware systems chosen and on designer choice. All such variations are within the scope of the disclosure. Likewise, software implementations of the described methods could be accomplished with standard programming techniques with rule-based logic and other logic to accomplish the various connection steps, processing steps, comparison steps, and decision steps.

It will be further understood by those within the art that if a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general, such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Further, unless otherwise noted, the use of the words "approximate," "about," "around," "substantially," etc., mean plus or minus ten percent.

Although the present embodiments have been particularly described with reference to preferred examples thereof, it should be readily apparent to those of ordinary skill in the art that changes and modifications in the form and details may be made without departing from the spirit and scope of the present disclosure. It is intended that the appended claims encompass such changes and modifications.

What is claimed is:

1. A switch having an input (IN) and output (OUT) comprising:

a max circuit configured to sense voltages at the IN and OUT and to generate a MAX voltage based thereon;

a min circuit configured to sense voltages at the IN and OUT and to generate a MIN voltage based thereon; and a dynamic switch connected between the IN and OUT and having two or more gates controlled using the MAX and MIN voltages, wherein the dynamic switch is implemented using thin oxide devices.

2. The switch of claim 1, wherein the dynamic switch includes a central switch including PMOS and NMOS devices connected in parallel between the IN and OUT and controlled by respective stacked inverters, wherein the stacked inverters receive the MAX and MIN voltages.

3. The switch of claim 2, wherein the PMOS and NMOS devices have gates connected to the respective stacked inverters.

4. The switch of claim 3, wherein in an enable mode, the PMOS gate of the central switch is configured to be controlled using the generated MIN voltage and the NMOS gate of the central switch is configured to be controlled using the generated MAX voltage.

5. The switch of claim 3, wherein a disable mode, the PMOS gate of the central switch is configured to be controlled using the generated MAX voltage and the NMOS gate of the central switch is configured to be controlled using the generated MIN voltage.

6. The switch of claim 1, wherein the max circuit is configured to generate the MAX voltage based on the sensed voltages at IN and OUT according to the following transfer function:

$$\begin{aligned} MAX &= 0.66 * VDDQ, \text{ when } \mathrm{Max}(IN, OUT) \le 0.66 * VDDQ \\ &= VDDQ, \text{ when } \mathrm{Max}(IN, OUT) > 0.66 * VDDQ \end{aligned}.$$

7. The switch of claim 1, wherein the min circuit is configured to generate the MIN voltage based on the sensed voltages at IN and OUT according to the following transfer function:

$$\begin{aligned} MIN &= 0, \text{ when } \mathrm{Min}(IN, OUT) \le 0.33 * VDDQ \\ &= 0.33 * VDDQ, \text{ when } \mathrm{Min}(IN, OUT) > 0.33 * VDDQ \end{aligned}.$$

8. A device comprising:

a plurality of switches coupled in parallel between an input (IN) and an output (OUT), each of the switches comprising:

a max circuit configured to sense voltages at the IN and OUT and to generate a MAX voltage based thereon;

a min circuit configured to sense voltages at the IN and OUT and to generate a MIN voltage based thereon; and a dynamic switch connected between the IN and OUT and having two or more gates controlled using the MAX and MIN voltages, wherein the dynamic switch is implemented using thin oxide devices.

9. The device of claim 8, wherein the min circuit is configured to generate the MIN voltage based on the sensed voltages at IN and OUT according to the following transfer function:

$$\begin{aligned} MIN &= 0, \text{ when } Min(IN, OUT) \le 0.33 * VDDQ \\ &= 0.33 * VDDQ, \text{ when } Min(IN, OUT) > 0.33 * VDDQ \end{aligned}.$$

10. The device of claim 8, wherein the max circuit is configured to generate the MAX voltage based on the sensed voltages at IN and OUT according to the following transfer function:

$$\begin{aligned} MAX &= 0.66 * VDDQ, \text{ when } Max(IN, OUT) \le 0.66 * VDDQ \\ &= VDDQ, \text{ when } Max(IN, OUT) > 0.66 * VDDQ \end{aligned}.$$

11. The device of claim 8, wherein the dynamic switch includes a central switch including PMOS and NMOS devices connected in parallel between the IN and OUT and controlled by respective stacked inverters, wherein the stacked inverters receive the MAX and MIN voltages, and wherein the PMOS and NMOS devices have gates connected to the respective stacked inverters.

12. The device of claim 11, wherein in an enable mode, the PMOS gate of the central switch is configured to be controlled using the generated MIN voltage and the NMOS gate of the central switch is configured to be controlled using the generated MAX voltage.

13. The device of claim 11, wherein a disable mode, the PMOS gate of the central switch is configured to be controlled using the generated MAX voltage and the NMOS gate of the central switch is configured to be controlled using the generated MIN voltage.

14. A method of operating a switch having an input (IN) and output (OUT) and implemented using thin oxide devices, the method comprising:

configuring a max circuit to sense voltages at the IN and OUT and to generate a MAX voltage based thereon;

configuring a min circuit to sense voltages at the IN and OUT and to generate a MIN voltage based thereon; and controlling two or more gates of a dynamic switch connected between the IN and OUT using the MAX and MIN voltages.

15. The method of claim 14, wherein the dynamic switch includes a central switch including PMOS and NMOS devices connected in parallel between the IN and OUT, the method further comprising:

configuring the PMOS and NMOS devices to be controlled by respective stacked inverters, wherein the stacked inverters receive the MAX and MIN voltages.

16. The method of claim 15, wherein the PMOS and NMOS devices have gates connected to the respective stacked inverters.

17. The method of claim 16, further comprising configuring the switch for operating in an enable mode, including configuring the PMOS gate of the central switch to be controlled using the generated MIN voltage and configuring the NMOS gate of the central switch to be controlled using the generated MAX voltage.

18. The method of claim 16, further comprising configuring the switch for operating in a disable mode, including configuring the PMOS gate of the central switch to be controlled using the generated MAX voltage and configuring the NMOS gate of the central switch to be controlled using the generated MIN voltage.

19. The method of claim 14, further comprising configuring the max circuit to generate the MAX voltage based on the sensed voltages at IN and OUT according to the following transfer function:

$$\begin{aligned} MAX &= 0.66 * VDDQ, \text{ when } Max(IN, OUT) \le 0.66 * VDDQ \\ &= VDDQ, \text{ when } Max(IN, OUT) > 0.66 * VDDQ \end{aligned}.$$

20. The method of claim 14, further comprising configuring the min circuit to generate the MIN voltage based on the sensed voltages at IN and OUT according to the following transfer function:

$$\begin{aligned} MIN &= 0, \text{ when } Min(IN, OUT) \le 0.33 * VDDQ \\ &= 0.33 * VDDQ, \text{ when } Min(IN, OUT) > 0.33 * VDDQ \end{aligned}.$$

* * * * *